(12) United States Patent
Ellis

(10) Patent No.: US 7,176,769 B1
(45) Date of Patent: Feb. 13, 2007

(54) HARMONIC TERMINATION CIRCUIT FOR MEDIUM BANDWIDTH MICROWAVE POWER AMPLIFIERS

(75) Inventor: Grant A. Ellis, Seattle, WA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/998,689

(22) Filed: Nov. 29, 2004

(51) Int. Cl.
  *H01P 5/12* (2006.01)
(52) U.S. Cl. .................. 333/125; 333/127; 330/302
(58) Field of Classification Search ............. 330/302, 330/295, 124 R; 333/101, 104, 125, 127
  See application file for complete search history.

(56) References Cited

U.S. PATENT DOCUMENTS

| | | | | |
|---|---|---|---|---|
| 4,435,688 A | * | 3/1984 | Shinkawa et al. | 331/99 |
| 5,095,285 A | * | 3/1992 | Khatibzadeh | 330/306 |
| 5,276,406 A | * | 1/1994 | Samay et al. | 330/277 |
| 5,300,895 A | * | 4/1994 | Jones | 330/251 |
| 5,329,249 A | * | 7/1994 | Cripps | 330/302 |
| 5,969,575 A | * | 10/1999 | Helms | 330/294 |
| 6,023,611 A | * | 2/2000 | Bolin et al. | 455/114.1 |
| 6,236,274 B1 | * | 5/2001 | Liu | 330/302 |
| 6,346,859 B1 | * | 2/2002 | Saitou | 330/286 |
| 6,587,018 B1 | * | 7/2003 | Meck et al. | 333/175 |
| 6,653,917 B2 | * | 11/2003 | Kang et al. | 333/99 S |
| 6,700,444 B2 | * | 3/2004 | Pengelly | 330/295 |
| 6,844,793 B2 | * | 1/2005 | Kenington | 333/101 |
| 2005/0083723 A1 | * | 4/2005 | Blednov et al. | 365/154 |
| 2005/0110576 A1 | * | 5/2005 | Rhodes | 330/305 |

* cited by examiner

*Primary Examiner*—Robert Pascal
*Assistant Examiner*—Kimberly E. Glenn
(74) *Attorney, Agent, or Firm*—Christie, Parker & Hale, LLP.

(57) ABSTRACT

A compact amplifier output bias circuit is used as a broadband harmonic termination. The bias circuit is adapted as a harmonic termination circuit to produce an effective low impedance at the signal harmonic frequencies while having the capability of supplying DC power to the amplifier stage, optionally, if needed. A pi network is coupled to an active device output through a predetermined length of transmission line tuned for optimum power added efficiency in the frequency band of operation and provides a low impedance at frequency bands above the frequency band of operation while allowing DC bias to be appliable to the active device output.

4 Claims, 8 Drawing Sheets

HARMONIC TERMINATION CIRCUIT FOR MEDIUM BANDWIDTH MICROWAVE POWER AMPLIFIERS

STATEMENT REGARDING FEDERALLY SPONSORED RESEARCH OR DEVELOPMENT

This invention was made with U.S. Government support under Contract No. N00014-03-C0241 awarded by the Office of Naval Research. The U.S. Government has certain rights to this invention.

CROSS-REFERENCE TO RELATED APPLICATION

This application is related to U.S. patent application Ser. No. 10/919,619, filed on Aug. 30, 2004, the entire contents of which is incorporated herein by reference.

BACKGROUND OF THE INVENTION

This invention relates to the field of power amplifiers, and, more particularly, to microwave power amplifier harmonic frequency termination combined with power added efficiency improvement.

Modern power amplifier architectures, such as balanced, push-pull, single ended and low noise power amplifiers, including microwave monolithic integrated circuit (MMIC) power amplifiers, have an increasing need for both linearity and power added efficiency.

Corporate feed networks, such as that shown in FIG. 1, are typically used to combine the outputs from many devices by terminating each device in the optimum load impedance for maximum power transfer. In corporate feed network 10 there are shown active device pairs 12$a$, 12$b$ and 12$c$, 12$d$, and which may include other pairs as indicated by the dotted lines providing an even amount of active devices. The active devices, such as field effect transistors (FETs) or bi-polar junction transistors (BJTs), are fed by inputs 14$a$–14$d$. The sum of each of the active devices travel collectively through transmission lines, bends and tees 16 and are summed at common output terminal 18 to drive, for example, an antenna or transmission line.

Each of the active devices receive input signals over a frequency band spanning from an operating frequency range from $f_1$ to $f_2$, about a center frequency $f_o$. Because the active devices provide power amplification, harmonics such as $2f_o$, $3f_o$, etc. are generated. Such harmonics can be problematic for other networks operating adjacent to the network. For larger power amplifier circuits that utilize a significant amount of space for output power combining and which also tend to be somewhat broadband in performance, it is difficult to adequately provide harmonic terminations because so much area is required for power combining.

Prior art approaches for harmonic terminations are typically narrow band and are usually accomplished using an RF choke and a large bypass capacitor as a low-pass filter coupled to the drain or collector of the amplifier stage. FIG. 2$a$ shows a typical prior art low pass filter, which passes DC but not any higher frequencies. Included are RF choke 20 and large by-pass capacitor 22 to stop RF while allowing DC to pass. At higher frequencies, referring to FIG. 2$b$, quarter-wave ($\lambda/4$) transformer 28 and bypass capacitor 22 may be used to supply the DC bias. Both approaches work quite well but are somewhat narrowband (less than 20%) and do not lend itself to medium bandwidth applications such as is typical with the corporate feed scheme.

A need therefore exists for a harmonic termination approach for modern power amplifiers which provides both linearity and power added efficiency without interfering with corporate power combining or feed distribution schemes. Embodiments in accordance with the present invention provide practical solutions to meet such need.

SUMMARY OF THE INVENTION

In accordance with the present invention a compact amplifier output bias circuit is used as a broadband harmonic termination while providing power added efficiency improvement. The bias circuit is adapted as a harmonic termination circuit to produce an effective low impedance (e.g., essentially a short circuit) at the signal harmonic frequencies (e.g., $3f_o$) over a significantly greater bandwidth than in the prior art, in addition to having the capability of supplying DC power to the amplifier stage, optionally, if needed.

In one aspect of the present invention the broadband termination of amplifier harmonics from an active device includes configuring a pi network providing a low impedance at frequency bands above a frequency band of operation while allowing DC bias to be appliable to the active device output and coupling the pi network to the active device output through a predetermined length of transmission line tuned for optimum power added efficiency in the frequency band of operation.

In one embodiment the pi network may include a low pass filter coupled to the predetermined length of transmission line, the low pass filter having an RF choke and a relatively large by-pass capacitor. A capacitive stub is coupled in parallel with the low pass filter, the capacitive stub being valued to resonate with the RF choke to produce a high impedance at a desired frequency and a low impedance to at least a third harmonic of the desired frequency.

In another aspect of the present invention a power combiner is provided having broadband termination of amplifier harmonics. A power combining network has a plurality of input ports and a power combined output port. Respective amplifiers are coupled to the input ports, each amplifier having an active device output. A pi network is configured to provide a low impedance at frequency bands above a frequency band of operation while allowing DC bias to be appliable to the active device output, wherein a respective pi network is coupled to each active device output through a respective predetermined length of transmission line tuned for optimum power added efficiency in the frequency band of operation. The pi network may include a low pass filter coupled to an active device drain through a predetermined length of transmission line tuned for optimum power added efficiency in the frequency band of operation, the low pass filter having an RF choke and a relatively large by-pass capacitor, and a capacitive stub coupled in parallel with the low pass filter, the capacitive stub being valued to resonate with the RF choke to produce a high impedance at a desired frequency and a low impedance to at least a third harmonic of the desired frequency.

DETAILED DESCRIPTION

Those skilled in the art can appreciate that it is desirable to operate a power amplifier in a nonlinear region where the amplifier gain is compressed to achieve maximum output power and efficiency. In compression, the drain current can be represented as: $I_d(t) = I_o + I_1 \cos(2\pi f_o t) + I_2 \cos(4\pi f_o t) + I_3 \cos(6\pi f_o t) + \ldots$ The components $I_2, I_3 \ldots$ are the harmonic current amplitudes. $I_1$ is the fundamental frequency ($f_o$) current amplitude. $I_o$ is the DC bias current amplitude.

An amplifier's Power Added Efficiency (PAE) measured in the band of operation is generally understood to be:

$$PAE = \frac{P_{out}(RF) - P_{in}(RF)}{\text{Total } P(DC)}$$

where $P_{out}(RF)$ is the RF output power of the amplifier; where $P_{in}(RF)$ is the RF input power of the amplifier; and where $P(DC)$ is the total DC power supplied to the amplifier. Relatedly, an amplifier's Drain Added Efficiency (DAE) measured in the band of operation is generally understood to be:

$$DAE = \frac{P_{out}(RF)}{\text{Total } P(DC)}$$

where $P_{out}(RF)$ is the RF output power of the drain of the amplifier; and where $P(DC)$ is the total DC power supplied to the amplifier.

If an amplifier has a significant amount of gain (where $P_{out} - P_{in}$ is essentially equal to $P_{out}$), then the DAE is essentially equal to the PAE. Both PAE and DAE are helpful criteria to quantify the efficiency of the amplifier, and are collectively referred to as PAE/DAE hereinafter.

Since there is a natural conflict between efficiency and distortion, when amplifiers are run in a gain compression mode, efficiency can be problematic when distortion effects, such as inter-modulation and harmonics, are present.

Further, there are two kinds of popular amplifier schemes. One is known as Class F, where there is a short circuited amplifier output at frequency $2f_o$ and an open circuited amplifier output at frequency $3f_o$. Another amplifier scheme is known as Inverse Class F, where there is an open circuited amplifier output at frequency $2f_o$ and a short circuited amplifier output at frequency $3f_o$. Those skilled in the art appreciate that if one of these two sets of terminations are provided to the device, there is better efficiency. However, when providing a short circuit at $3f_o$ frequency, efficiency can be improved, but depending on the device, the size of the device, and some of the parasitics in the device, the Class F and Inverse Class F relationships are only approximately correct.

The present invention not only provides a compact amplifier output bias circuit but one that can be used as a broadband harmonic termination while maintaining an optimum in-band PAE/DAE.

Figure 1:
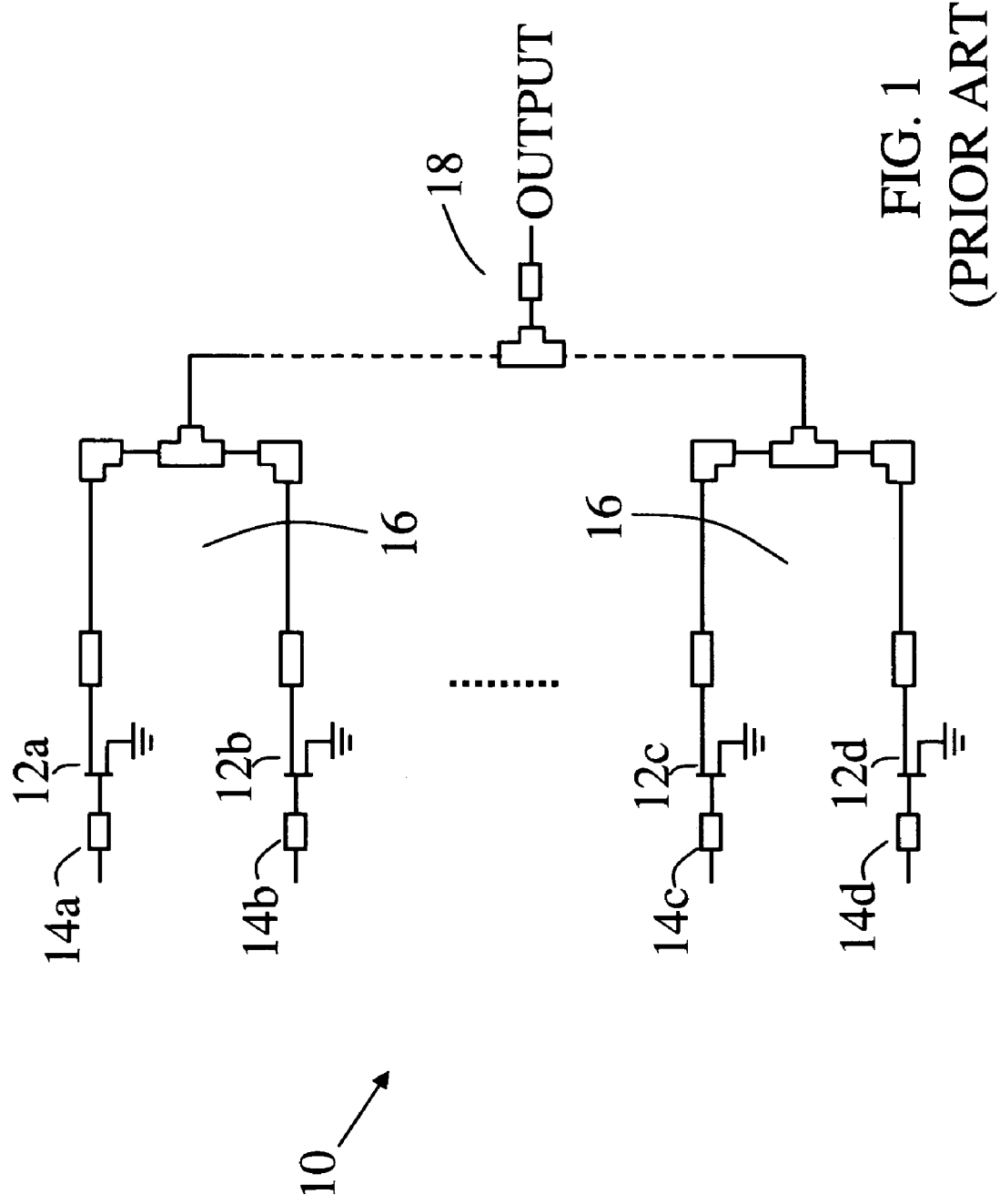
FIG. 1 shows a conventional corporate power combiner network.
Figure 2A:
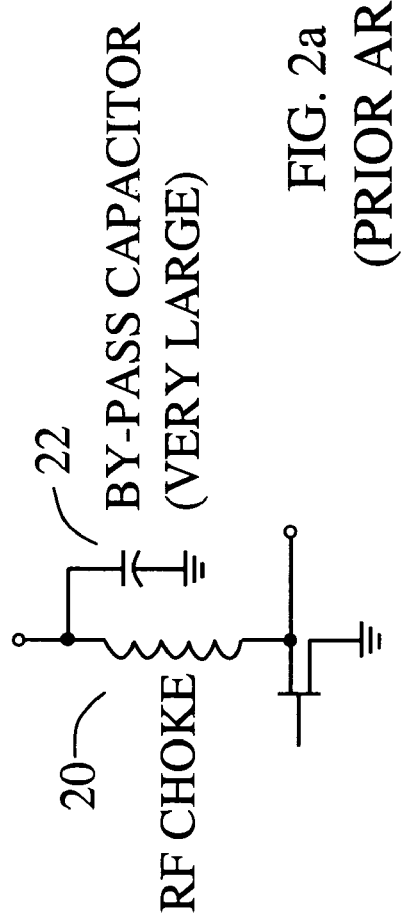
FIGS. 2$a$ and 2$b$ show conventional harmonic termination circuits.
Figure 3:
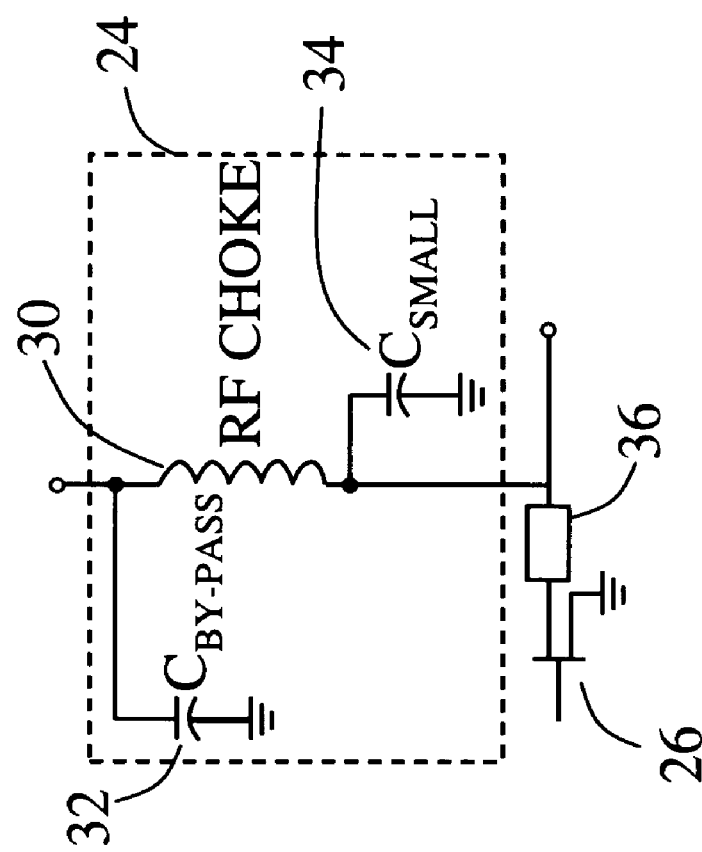
FIG. 3 shows an exemplary embodiment of a harmonic termination circuit in accordance with the present invention.

FIG. 3 shows an exemplary embodiment of a harmonic termination circuit in accordance with the present invention. The prior art low pass filter as shown in FIG. 2a is modified to a pi network 24 to provide essentially a band pass response and to provide an effective low impedance (e.g., nearly a short circuit) at frequency bands above the frequency band of operation, including harmonics, while also allowing (optionally as desired) the filter to pass DC so that a particular amplifier stage (active device) can be biased if needed. In FIG. 3, as in the prior art, RF choke 30 and by-pass capacitor 32 are provided similar to the filter circuit components depicted in FIG. 2a. Small capacitor 34 (e.g., a capacitive stub), is added to resonate with RF choke 30 to produce a high impedance to the output drain of active device 26 in the band around $f_o$ and a low impedance at its harmonic frequency $3f_o$. A short length of transmission line 36 tuned at $f_o$ for optimum PAE/DAE is provided between the output drain of active device 26 and pi network 24. In essence, the harmonic termination circuit coupled to the active device provides essentially an open circuit at the operating frequency band and a short circuit at the third harmonic frequency band.

Figure 4:
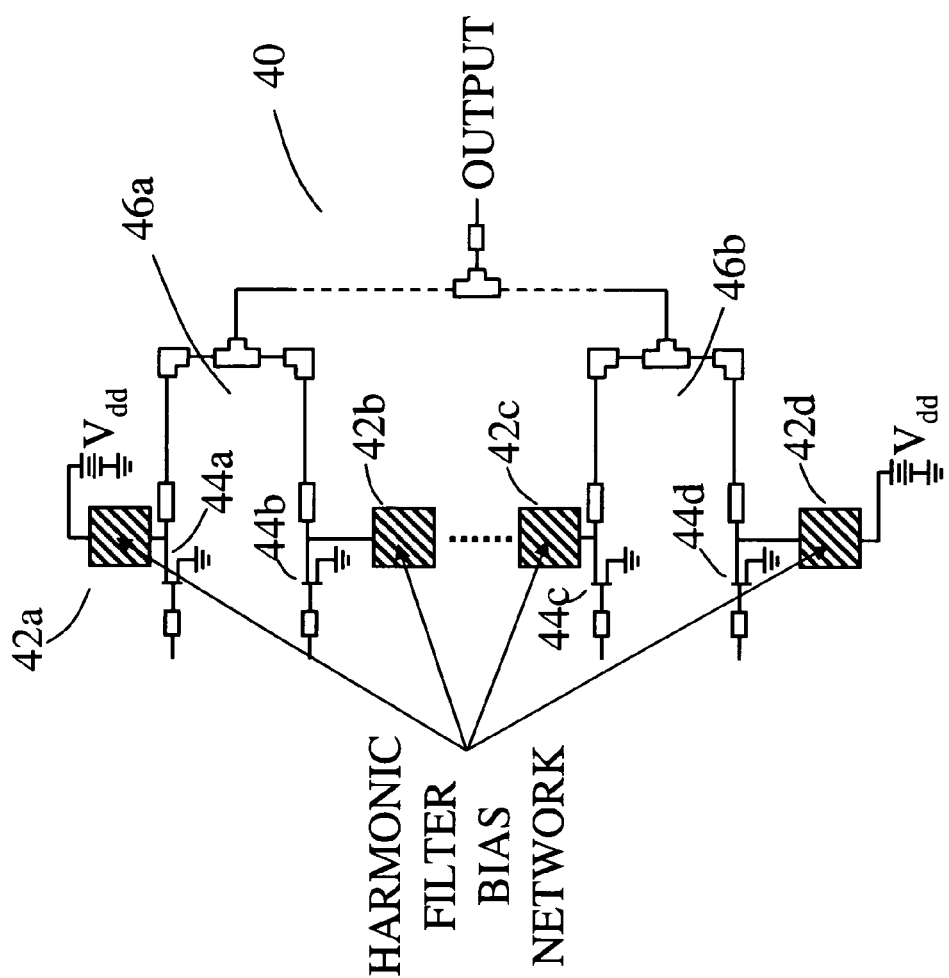
FIG. 4 shows an exemplary embodiment of a power combiner network implementing harmonic termination circuits in accordance with the present invention.

FIG. 4 shows an exemplary embodiment of the present invention for the harmonic termination circuit in a corporate power-combining network. Power combining network 40 has a plurality of harmonic termination circuits 42a–42d attached to each of the active devices 44a–44d. Of note is that some harmonic termination circuits 42a, 42d may be optionally coupled to bias voltage Vdd, while other harmonic termination circuits 42b, 42c are not coupled to the bias voltages Vdd. This occurs as a result of the DC capability of current flowing through the combining network sub-sections 46a, 46b and into bias harmonic termination circuits 42b, 42c respectively. As such, a direct bias voltage Vdd is not typically needed to be coupled to harmonic termination circuits 42b, 42c. Further, the harmonic termination circuits 42a, 42d with the direct bias voltage Vdd coupled thereto may have an additional RF choke and a large by-pass capacitor to ground between the bias source Vdd and the input to the harmonic filter bias network 42a, 42d to only allow DC to pass through. Accordingly, the harmonic termination circuit in accordance with the present invention can therefore be used as an individual harmonic termination for interior devices or cells without providing the DC biasing.

Figure 5:
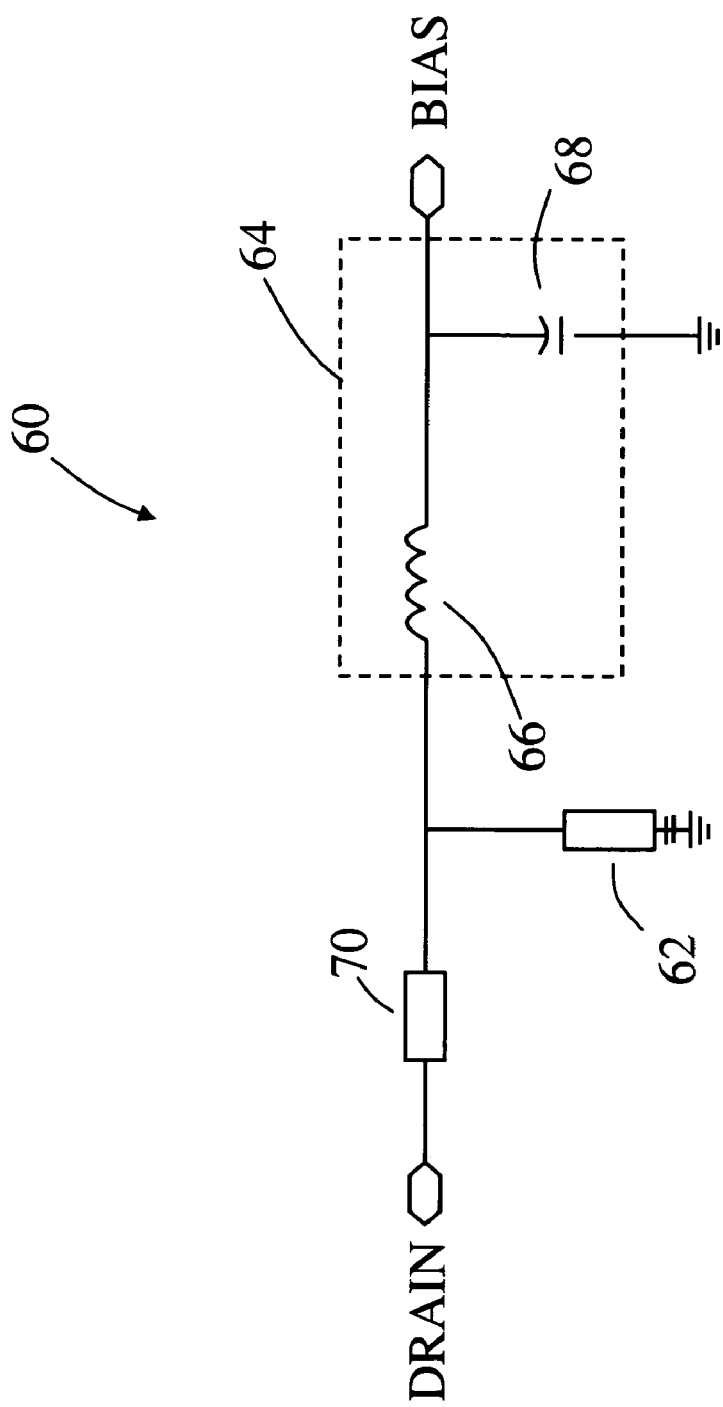
FIG. 5 shows an exemplary embodiment of a harmonic termination circuit in accordance with the present invention.

FIG. 5 shows a schematic diagram of modified bias network 60 useful for providing an optimum reactance or reflection at $3f_o$ (18–27 GHz) for a 6×100 um gallium nitride (GaN) high electron mobility transistor (HEMT). Here, short capacitive stub 62 coupled to low pass filter 64 having RF choke 66 and by-pass capacitor 68 is used to modify the bias network by presenting a capacitive reactance at the third harmonic frequencies. The bias network including the capacitive stub was optimized to improve the PAE/DAE in the band of operation (6–9 GHz). A short section of transmission line 70 is included in the network to tune for maximum PAE/DAE at mid-band (7.5 GHz). Additionally, the effects of the capacitive reactance in the modified bias network is kept minimum by maintaining a high impedance in the band of operation.

In more detail, in accordance with an exemplary embodiment of the present invention, typical low pass filter 64 has been modified by (1) adding small capacitive stub 62, e.g., in one embodiment a section of line 0.010" long and 0.006" wide, so that impedances are transformed so that there is approximately a short circuit at $3f_o$ (and over its 18–27 GHz bandwidth), and (2) adding a short section of transmission line (e.g., 6 electrical degrees at 7.5 GHz) to maximize the PAE/DAE of the amplifier at the center frequency $f_o$ of the amplifier's band of operation. In this embodiment, by-pass capacitor 68 would be 29 pf, RF choke 66 would be 5.1 nH, and capacitive stub 62 would have an equivalent reactance of $-j288\Omega$ at 6 GHz and $-j192\Omega$ at 9 GHz.

Figure 6:
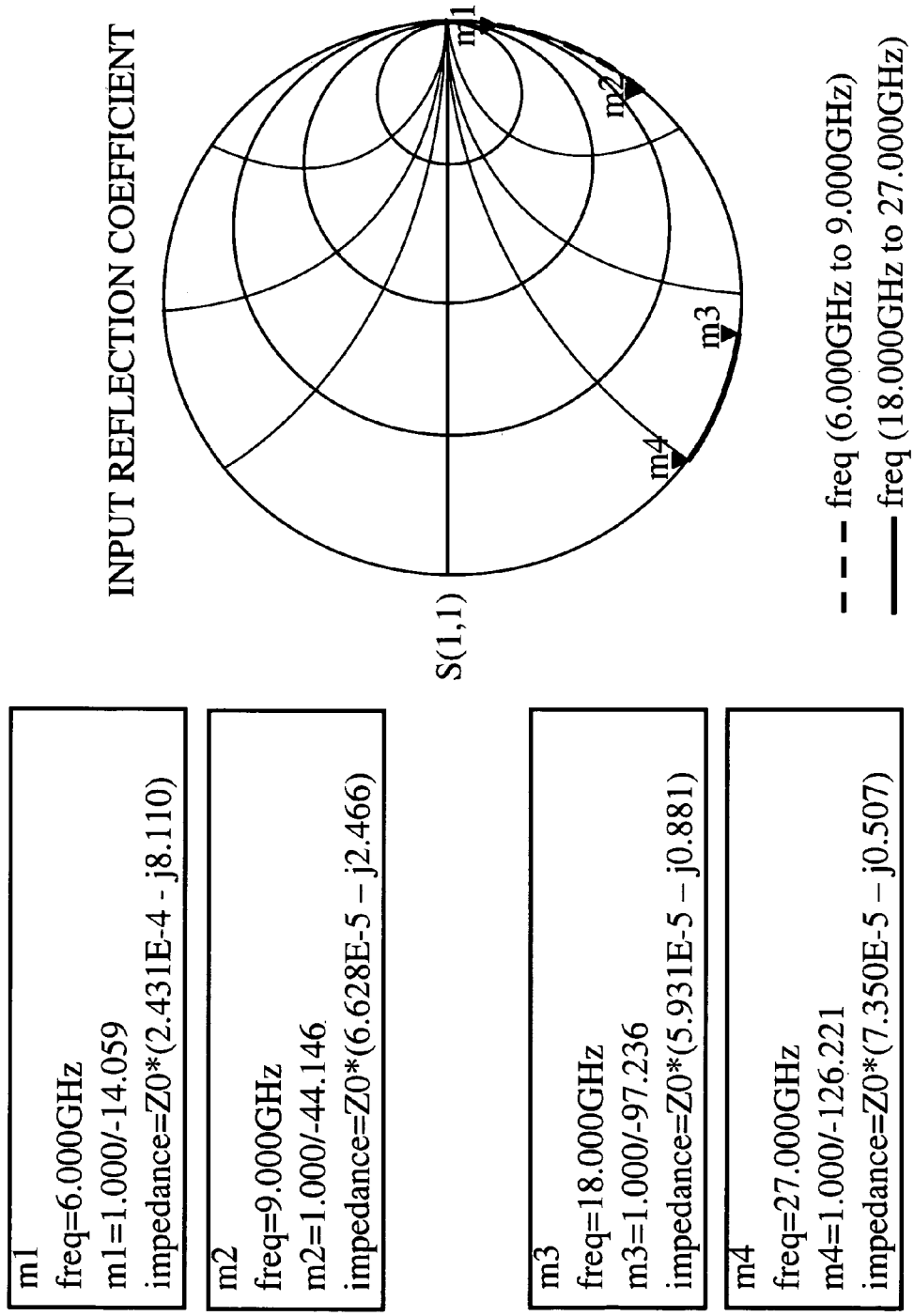
FIG. 6 graphically shows a Smith Chart depicting input reflection coefficients of an exemplary embodiment of the present invention over both a band of operation and a third harmonic band.

Referring to FIG. 6, in band (e.g., 6–9 GHz) the short section of transmission line and the small capacitive stub having a small capacitance and a very large reactance does not interrupt the $f_o$ band operation, while providing an optimum load impedance for the $3f_o$ band operation (18–27 GHz). As seen in FIG. 6, the Input Reflection Coefficient for both the $f_o$ band and the $3f_o$ band are depicted. At the $3f_o$ band (m3 to m4), the impedance is approximately 60 degrees from being an ideal short circuit, while at the $f_o$ band (m1 to m2) the impedance is close to being an open circuit. The resulting input impedances to the bias network at the third harmonic frequencies are $-j25\Omega$ to $-j44\Omega$. These impedances are the optimum load impedance or "sweet spot" for a maximum PAE/DAE for this device.

Figure 2B:
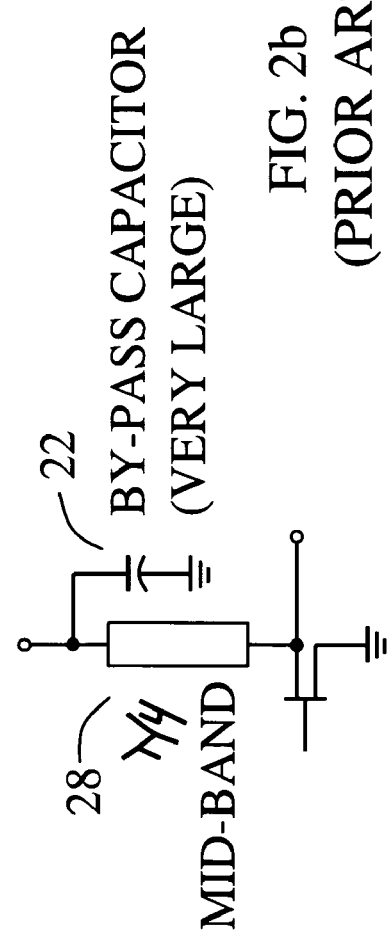
Figure 7:
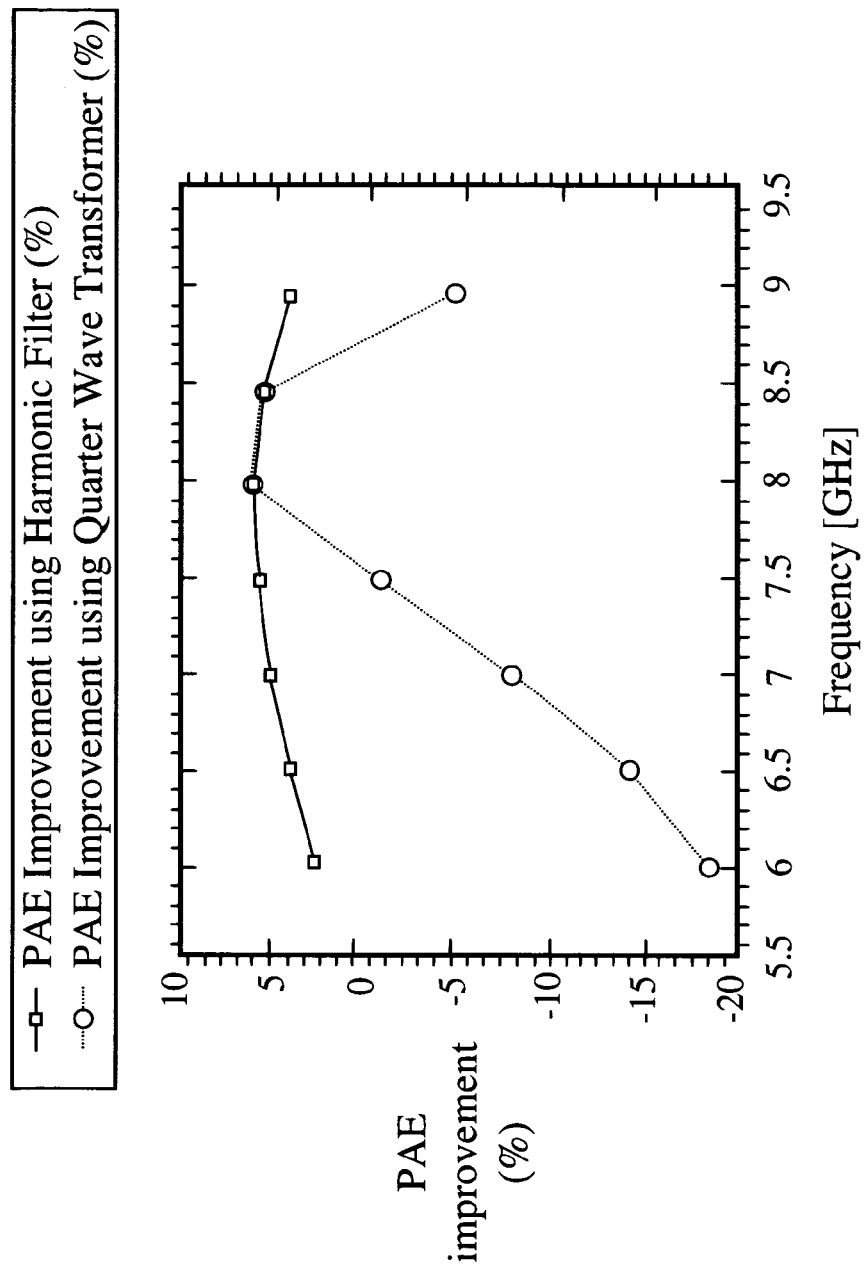
FIG. 7 graphically compares PAE results when implementing an exemplary embodiment of the present invention with that of a quarter wave line transformer.

Referring to FIG. 7, the improvement in the peak PAE/DAE in accordance with the embodiment of the present invention shown in FIG. 5 vs. using the conventional RF choke and bypass capacitor shown in FIG. 2*b* is depicted. The peak PAE/DAE which results for a quarter wave ($\lambda/4$) transformer tuned at mid-band (e.g., 7.5 GHz) is shown for comparison. At $2f_o$, the conventional circuit results in a short circuit at the drain and at $3f_o$, it becomes an open circuit. While this may result in an improvement in PAE/DAE at or near 7.5 GHz, the PAE is quickly lowered at or near the band edges. As can be seen, there is a significant improvement of between 2.8%–6.2% in peak PAE/DAE over a 40% bandwidth when using the embodiment in accordance with the present invention over that when using a conventional RF choke and bypass capacitor.

The harmonic bias networks described in the above exemplary embodiments are representative of lumped filter realizations that can be used effectively through the X band frequency range. Those skilled in the art can appreciate that still further exemplary embodiments of the harmonic bias filter in accordance with the present invention can use distributed or transmission line-like elements for use at higher frequencies where lumped elements do not work very well at all, such as above 20 GHz.

Figure 8:
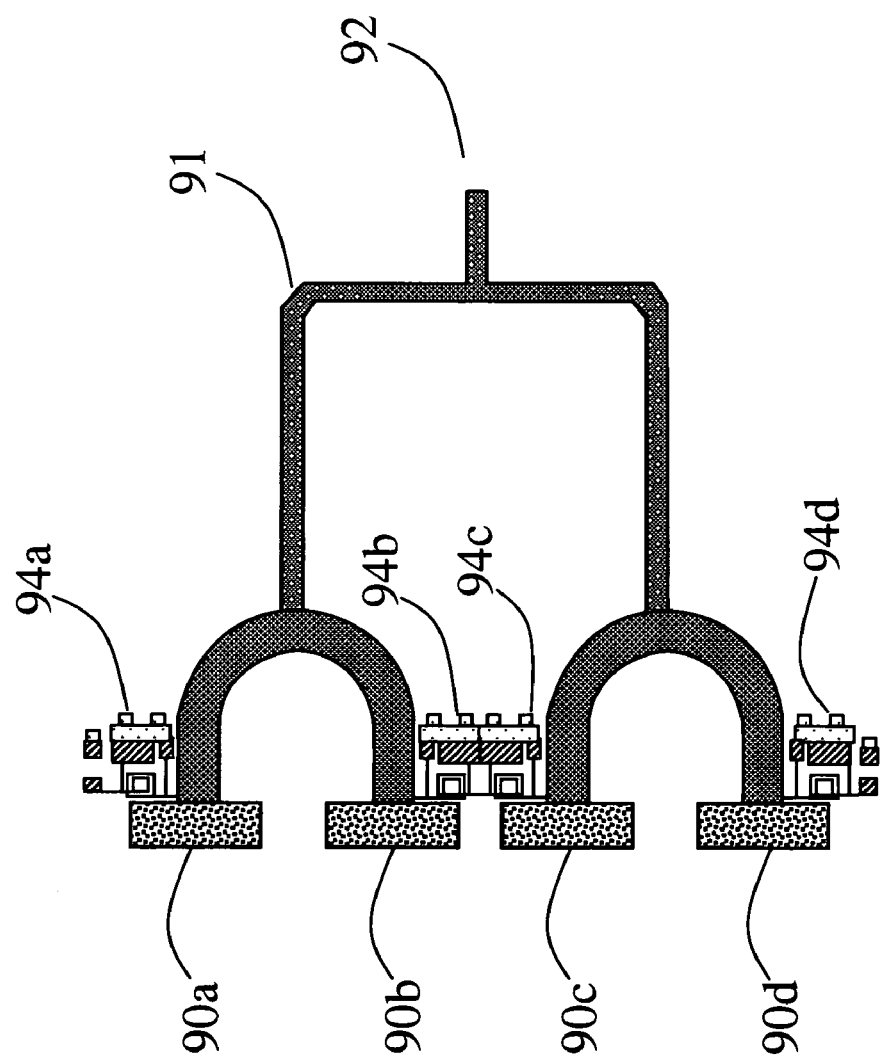
FIG. 8 shows yet another exemplary embodiment of a power combiner network implementing harmonic termination circuits in accordance with the present invention.

FIG. 8 shows a further exemplary embodiment of harmonic termination circuits in combination with a power amplifier output combiner. Four large 10×125 µm GaN HEMTs 90*a*, 90*b*, 90*c*, 90*d* supply RF power to be provided to output 92 through feed network 91. Harmonic termination circuits 94*a*, 94*b*, 94*c*, 94*d*, such as those described above in conjunction with FIGS. 3 and 5, are coupled to the respective HEMT transistor drains as described above.

Those skilled in the art can also appreciate that the principles set forth above can, in addition to dealing with $3f_o$ harmonic termination, could also be adapted to apply to higher harmonic frequency termination.

Therefore, while bias networks have been traditionally used only for supplying DC power to amplifier stages, in accordance with the present invention the use of the bias networks as harmonic terminations can:

(1) increase power added efficiency (up to 6%) for power amplifiers where medium bandwidth is sought;

(2) increase both harmonic termination capability and power added efficiency for power amplifiers requiring high output power levels e.g., power amplifiers using a corporate feed structure; and (3) because the harmonic filter network is incorporated into the biasing scheme and is relatively compact, it does not interfere with the signal flow used in the popular corporate feed distribution topology.

The invention claimed is:

1. A method of broadband termination of amplifier harmonics from an active device, comprising:

configuring a pi network providing a low impedance at frequency bands above a frequency band of operation while allowing DC bias to be appliable to the active device output; and coupling the pi network to the active device output through a predetermined length of transmission line tuned for optimum power added efficiency in the frequency band of operation, wherein configuring the pi network includes:

coupling a low pass filter to the predetermined length of transmission line, the low pass filter having an RF choke and a by-pass capacitor; and coupling a capacitive stub in parallel with the low pass filter, the capacitive stub being valued to resonate with the RF choke to produce a high impedance at a desired frequency and a low impedance to at least a third harmonic of the desired frequency.

2. A broadband harmonic termination apparatus for an active device output comprising:

a pi network coupleable to the active device output through a predetermined length of transmission line tuned for optimum power added efficiency in a frequency band of operation, the pi network providing a low impedance at frequency bands above the frequency band of operation while allowing DC bias to be applied to the active device output, wherein the pi network includes:

a low pass filter coupled to an active device drain through the predetermined length of transmission line, the low pass filter having an RF choke and a by-pass capacitor; and a capacitive stub coupled in parallel with the low pass filter, the capacitive stub being valued to resonate with the RF choke to produce a high impedance at a desired frequency and a low impedance to at least a third harmonic of the desired frequency.

3. A method of power combining having broadband termination of amplifier harmonics, comprising:

providing a power combining network having a plurality of input ports and a power combined output port;

coupling respective amplifiers to the input ports, each amplifier having an active device output;

configuring a pi network providing a low impedance at frequency bands above a frequency band of operation while allowing DC bias to be appliable to the active device output and coupling a respective pi network to each active device output through a respective predetermined length of transmission line tuned for optimum power added efficiency in the frequency band of operation, wherein configuring the pi network includes:
coupling a low pass filter to the predetermined length of transmission line, the low pass filter having an RF choke and a by-pass capacitor; and
coupling a capacitive stub in parallel with the low pass filter, the capacitive stub being valued to resonate with the RF choke to produce a high impedance at a desired frequency and a low impedance to at least a third harmonic of the desired frequency.

4. A power combiner having broadband termination of amplifier harmonics, comprising:
a power combining network having a plurality of input ports and a power combined output port;
respective amplifiers coupled to the input ports, each amplifier having an active device output; and
a pi network configured to provide a low impedance at frequency bands above a frequency band of operation while allowing DC bias to be appliable to the active device output, wherein a respective pi network is coupled to each active device output through a respective predetermined length of transmission line tuned for optimum power added efficiency in the frequency band of operation,
wherein the pi network includes:
a low pass filter coupled to the predetermined length of transmission line, the low pass filter having an RF choke and a by-pass capacitor; and
a capacitive stab coupled in parallel with the low pass filter, the capacitive stub being valued to resonate with the RF choke to produce a high impedance at a desired frequency and a low impedance to at least a second harmonic of the desired frequency.

* * * * *